United States Patent
Catalano et al.

(10) Patent No.: US 9,429,280 B2
(45) Date of Patent: Aug. 30, 2016

(54) LIGHT EMITTING DIODE REPLACEMENT LAMP

(71) Applicant: TerraLUX, Inc., Longmont, CO (US)

(72) Inventors: Anthony W. Catalano, Lafayette, CO (US); Daniel J. Harrison, Nederland, CO (US)

(73) Assignee: TerraLUX, Inc., Longmont, CO (US)

( * ) Notice: Subject to any disclaimer, the term of this patent is extended or adjusted under 35 U.S.C. 154(b) by 343 days.

(21) Appl. No.: 14/104,516

(22) Filed: Dec. 12, 2013

(65) Prior Publication Data

US 2014/0168986 A1    Jun. 19, 2014

Related U.S. Application Data

(60) Continuation of application No. 13/093,197, filed on Apr. 25, 2011, now Pat. No. 8,632,215, which is a continuation-in-part of application No. 12/546,377, filed on Aug. 24, 2009, now Pat. No. 7,946,730, which is a continuation of application No. 11/868,406, filed on Oct. 5, 2007, now Pat. No. 7,597,456, which is a division of application No. 10/893,727, filed on Jul. 16, 2004, now Pat. No. 7,296,913.

(60) Provisional application No. 60/517,130, filed on Nov. 4, 2003.

(51) Int. Cl.
*F21V 13/10* (2006.01)
*F21V 13/04* (2006.01)
(Continued)

(52) U.S. Cl.
CPC .......... *F21K 9/50* (2013.01); *F21K 9/137* (2013.01); *F21K 9/52* (2013.01); *F21K 9/58* (2013.01); *F21V 23/003* (2013.01); *F21V 29/505* (2015.01); *F21V 29/83* (2015.01); *H05B 33/0815* (2013.01); *H05B 33/0821* (2013.01); *H05B 33/0851* (2013.01); *H05B 33/0854* (2013.01); *F21S 9/022* (2013.01); *F21S 10/06* (2013.01); *F21V 7/0008* (2013.01);
(Continued)

(58) Field of Classification Search
CPC ...... F21V 13/04; F21V 13/10; F21V 23/003; F21K 9/50; F21K 9/52; F21K 9/58; F21K 9/137; H05B 33/0815; H05B 33/0821; H05B 33/0851; H05B 33/0854; F29V 29/83; F29V 29/505
USPC ........... 362/240, 249.02, 257, 551, 555, 545
See application file for complete search history.

(56) References Cited

U.S. PATENT DOCUMENTS

3,795,830 A    3/1974    Richardson
4,211,955 A    7/1980    Ray
(Continued)

FOREIGN PATENT DOCUMENTS

AU    2012250206 B2    7/2014
CN    103502729 A    1/2014
(Continued)

OTHER PUBLICATIONS

Haiziao, Han, "Office Action and Search Report re Application No. 201280020295.8", Aug. 24, 2015, p. 22 Published in: CN.
(Continued)

*Primary Examiner* — Thomas M Sember
(74) *Attorney, Agent, or Firm* — Neugeboren O'Dowd PC

(57) ABSTRACT

In various embodiments, an illumination device includes a housing, a power connector for connecting the illumination device to a power socket and receiving input power, a light emitter for direct illumination disposed within the housing, a circuit for regulating the input power and providing the regulated power to the light emitter, and a decorative illumination element for providing decorative illumination.

36 Claims, 12 Drawing Sheets

(51) Int. Cl.
    *F21K 99/00*        (2016.01)
    *H05B 33/08*        (2006.01)
    *F21V 23/00*        (2015.01)
    *F21V 29/505*       (2015.01)
    *F21V 29/83*        (2015.01)
    *F21S 9/02*             (2006.01)
    *F21V 7/00*             (2006.01)
    *F21Y 101/02*           (2006.01)
    *F21Y 113/00*           (2016.01)
    *H01L 25/075*           (2006.01)
    *H01L 33/58*            (2010.01)
    *H01L 33/60*            (2010.01)
    *F21S 10/06*            (2006.01)
    *F21W 121/00*           (2006.01)
    *F21V 14/04*            (2006.01)
    *F21V 14/06*            (2006.01)
    *F21V 29/70*            (2015.01)

(52) U.S. Cl.
    CPC ............. *F21V 14/04* (2013.01); *F21V 14/06* (2013.01); *F21V 29/70* (2015.01); *F21W 2121/00* (2013.01); *F21Y 2101/02* (2013.01); *F21Y 2113/005* (2013.01); *H01L 25/0753* (2013.01); *H01L 33/58* (2013.01); *H01L 33/60* (2013.01); *H01L 2224/48091* (2013.01); *Y02B 20/383* (2013.01)

(56) References Cited

U.S. PATENT DOCUMENTS

| | | | |
|---|---|---|---|
| 4,214,295 A | 7/1980 | Morton | |
| 4,727,289 A | 2/1988 | Uchida | |
| 4,783,726 A | 11/1988 | Wang | |
| 4,999,750 A | 3/1991 | Gammache | |
| 5,097,180 A | 3/1992 | Ignon et al. | |
| 5,189,339 A | 2/1993 | Peshak | |
| 5,222,800 A | 6/1993 | Chan et al. | |
| 5,463,280 A | 10/1995 | Johnson | |
| 5,465,197 A | 11/1995 | Chien | |
| 5,473,525 A | 12/1995 | Stout | |
| 5,506,760 A | 4/1996 | Giebler et al. | |
| 5,555,161 A | 9/1996 | Roe et al. | |
| 5,561,346 A | 10/1996 | Byrne | |
| 5,575,459 A | 11/1996 | Anderson | |
| 5,632,551 A | 5/1997 | Roney et al. | |
| 5,655,830 A | 8/1997 | Ruskouski | |
| 5,663,719 A | 9/1997 | Deese et al. | |
| 5,749,646 A | 5/1998 | Brittell | |
| 5,806,973 A | 9/1998 | Porter | |
| 5,850,126 A | 12/1998 | Kanbar | |
| 5,935,599 A | 8/1999 | Dadey | |
| 5,936,599 A | 8/1999 | Reymond | |
| 5,994,845 A | 11/1999 | Gibboney, Jr. | |
| 6,019,493 A | 2/2000 | Kuo et al. | |
| 6,091,614 A | 7/2000 | Malenfant | |
| 6,111,739 A | 8/2000 | Wu et al. | |
| 6,140,776 A | 10/2000 | Rachwal | |
| 6,150,771 A | 11/2000 | Perry | |
| 6,161,910 A | 12/2000 | Reisenauer et al. | |
| 6,184,628 B1 | 2/2001 | Ruthenberg | |
| 6,190,020 B1 | 2/2001 | Hartley | |
| 6,218,785 B1 | 4/2001 | Incerti | |
| 6,220,722 B1 | 4/2001 | Begemann | |
| 6,232,784 B1 | 5/2001 | Dulasky | |
| 6,234,645 B1 | 5/2001 | Börner et al. | |
| 6,234,648 B1 | 5/2001 | Borner et al. | |
| 6,242,870 B1 | 6/2001 | Koyanagi et al. | |
| 6,285,139 B1 | 9/2001 | Ghanem | |
| 6,310,445 B1 | 10/2001 | Kashaninejad | |
| 6,313,589 B1 | 11/2001 | Kobayashi et al. | |
| 6,357,889 B1 | 3/2002 | Duggal et al. | |
| 6,371,636 B1 | 4/2002 | Wesson | |
| 6,380,865 B1 | 4/2002 | Pederson | |
| 6,485,160 B1 | 11/2002 | Sommers et al. | |
| 6,528,954 B1 | 3/2003 | Lys et al. | |
| 6,570,505 B1 | 5/2003 | Malenfant | |
| 6,580,228 B1 | 6/2003 | Chen et al. | |
| 6,595,671 B2 | 7/2003 | Lefebvre et al. | |
| 6,626,557 B1 | 9/2003 | Taylor | |
| 6,634,771 B2 | 10/2003 | Cao | |
| 6,644,841 B2 | 11/2003 | Martineau | |
| 6,727,652 B2 | 4/2004 | Sivacumarran | |
| 6,733,152 B2 | 5/2004 | Maglica | |
| 6,791,283 B2 | 9/2004 | Bowman et al. | |
| 6,793,374 B2 | 9/2004 | Begemann | |
| 6,819,056 B2 | 11/2004 | Lin | |
| 6,853,151 B2 | 2/2005 | Leong et al. | |
| 6,857,756 B2 | 2/2005 | Reiff et al. | |
| 6,871,983 B2 | 3/2005 | Jacob et al. | |
| 6,880,951 B2 | 4/2005 | Yoon | |
| 6,882,111 B2 | 4/2005 | Kan et al. | |
| 6,893,140 B2 | 5/2005 | Storey et al. | |
| 6,924,605 B2 | 8/2005 | Chun | |
| 6,924,606 B2 | 8/2005 | Yu et al. | |
| 6,948,829 B2 | 9/2005 | Verdes et al. | |
| 6,957,897 B1 | 10/2005 | Nelson et al. | |
| 6,981,784 B2 | 1/2006 | Dubuc | |
| 7,008,084 B2 | 3/2006 | Galli | |
| 7,015,650 B2 | 3/2006 | McGrath | |
| 7,118,249 B2 | 10/2006 | Hsu et al. | |
| 7,160,012 B2 | 1/2007 | Hilscher et al. | |
| 7,204,602 B2 | 4/2007 | Archer | |
| RE39,856 E | 9/2007 | Ruthenberg | |
| 7,296,913 B2 | 11/2007 | Catalano et al. | |
| 7,300,173 B2 | 11/2007 | Catalano et al. | |
| 7,318,661 B2 | 1/2008 | Catalano | |
| 7,448,770 B2 | 11/2008 | Catalano et al. | |
| 7,597,456 B2 | 10/2009 | Catalano et al. | |
| 7,604,378 B2 | 10/2009 | Wolf et al. | |
| 7,699,494 B2 | 4/2010 | Catalano et al. | |
| 7,777,430 B2 | 8/2010 | Catalano et al. | |
| 7,852,015 B1 | 12/2010 | Yen et al. | |
| 7,946,730 B2 | 5/2011 | Catalano et al. | |
| 8,033,682 B2 | 10/2011 | Catalano et al. | |
| 8,222,801 B2 | 7/2012 | Wang et al. | |
| 8,240,873 B2 | 8/2012 | Catalano et al. | |
| 8,297,796 B2 | 10/2012 | Catalano | |
| 8,328,385 B2 | 12/2012 | Catalano et al. | |
| 8,328,386 B2 | 12/2012 | Catalano et al. | |
| 8,400,081 B2 | 3/2013 | Catalano et al. | |
| 8,529,088 B2 | 9/2013 | Catalano et al. | |
| 8,632,215 B2 | 1/2014 | Catalano et al. | |
| 8,702,275 B2 | 4/2014 | Catalano et al. | |
| 8,746,930 B2 | 6/2014 | Catalano et al. | |
| 8,823,290 B2 | 9/2014 | Catalano et al. | |
| 9,049,768 B2 | 6/2015 | Catalano et al. | |
| 9,057,489 B2 | 6/2015 | Catalano et al. | |
| 2001/0014019 A1 | 8/2001 | Begemann | |
| 2002/0030455 A1 | 3/2002 | Ghanem | |
| 2002/0130786 A1 | 9/2002 | Weindorf | |
| 2002/0141196 A1 | 10/2002 | Camarota et al. | |
| 2002/0176250 A1 | 11/2002 | Bohler et al. | |
| 2003/0039122 A1 | 2/2003 | Cao | |
| 2003/0067787 A1 | 4/2003 | Serizawa | |
| 2003/0076128 A1 | 4/2003 | Ohtaki | |
| 2003/0103348 A1 | 6/2003 | Hung | |
| 2003/0112627 A1 | 6/2003 | Deese | |
| 2003/0179548 A1 | 9/2003 | Becker et al. | |
| 2003/0210552 A1 | 11/2003 | Barlian et al. | |
| 2004/0028099 A1 | 2/2004 | Hongo et al. | |
| 2004/0070990 A1 | 4/2004 | Szypszak | |
| 2004/0189262 A1 | 9/2004 | McGrath | |
| 2004/0190286 A1 | 9/2004 | Chapman | |
| 2005/0052865 A1 | 3/2005 | Siktberg et al. | |
| 2005/0057187 A1 | 3/2005 | Catalano | |
| 2005/0225985 A1 | 10/2005 | Catalano et al. | |
| 2005/0231948 A1 | 10/2005 | Pohlert et al. | |
| 2006/0012997 A1 | 1/2006 | Catalano et al. | |
| 2006/0250270 A1 | 11/2006 | Tangen | |
| 2007/0019415 A1 | 1/2007 | Leblanc et al. | |
| 2008/0019123 A1 | 1/2008 | Catalano et al. | |

(56) References Cited

U.S. PATENT DOCUMENTS

| | | |
|---|---|---|
| 2008/0024070 A1 | 1/2008 | Catalano et al. |
| 2008/0099770 A1 | 5/2008 | Mendendorp et al. |
| 2008/0130288 A1 | 6/2008 | Catalano et al. |
| 2009/0034262 A1 | 2/2009 | Catalano et al. |
| 2009/0309501 A1 | 12/2009 | Catalano et al. |
| 2010/0027085 A1 | 2/2010 | Catalano |
| 2010/0117560 A1 | 5/2010 | Cao |
| 2010/0165611 A1 | 7/2010 | Catalano et al. |
| 2010/0320499 A1 | 12/2010 | Catalano et al. |
| 2011/0019417 A1 | 1/2011 | Van Laanen et al. |
| 2011/0260647 A1 | 10/2011 | Catalano et al. |
| 2012/0044673 A1 | 2/2012 | Catalano et al. |
| 2012/0044674 A1 | 2/2012 | Catalano et al. |
| 2012/0051035 A1 | 3/2012 | Catalano et al. |
| 2012/0120649 A1 | 5/2012 | Catalano et al. |
| 2012/0134150 A1 | 5/2012 | Catalano et al. |
| 2012/0320575 A1 | 12/2012 | Catalano et al. |
| 2013/0214685 A1 | 8/2013 | Catalano et al. |
| 2014/0036488 A1 | 2/2014 | Catalano et al. |
| 2014/0036489 A1 | 2/2014 | Catalano et al. |
| 2014/0217926 A1 | 8/2014 | Catalano et al. |
| 2014/0218914 A1 | 8/2014 | Catalano et al. |

FOREIGN PATENT DOCUMENTS

| | | |
|---|---|---|
| EP | 1081771 A2 | 3/2001 |
| EP | 2390555 A1 | 11/2011 |
| EP | 2702323 A1 | 3/2014 |
| JP | 2004-119287 A | 4/2004 |
| JP | 2004-146205 A | 5/2004 |
| JP | 2004146205 A | 5/2004 |
| JP | 2007-234386 A | 9/2007 |
| JP | 2010-244950 A | 10/2010 |
| JP | 3164202 U | 10/2010 |
| JP | 2011-14505 A | 1/2011 |
| JP | 2012-99297 A | 5/2012 |
| JP | 2014-516466 A | 7/2014 |
| WO | 2010/084546 A1 | 7/2010 |
| WO | 2012/148585 A1 | 11/2012 |

OTHER PUBLICATIONS

Examination Report Received for Australian Patent Application No. 2012250206 mailed on May 21, 2014, 2 pages.
Examination Report Received for Canadian Patent Application No. 2833344 mailed on Oct. 23, 2014, 2 pages.
Examination Report Received for Japanese Patent Application No. 2014-508352 mailed on Aug. 19, 2014, 12 pages (7 pages of English Translation & 5 pages of Official copy).
Examiners Decision of Final Refusal Received for Japanese Patent Application No. 2014-508352 mailed on Jan. 20, 2015, 2 pages.
International Patent Application No. PCT/US2012/028990, International Search Report and Written Opinion mailed Sep. 6, 2012, 7 pages.
International Patent Application No. PCT/US2012/028990, International Preliminary Report on Patentability mailed Nov. 7, 2013, 6 pages.

(a)

(b)

LIGHT EMITTING DIODE REPLACEMENT LAMP

CROSS-REFERENCE TO RELATED APPLICATIONS

This application is a continuation of U.S. patent application Ser. No. 13/093,197, filed on Apr. 25, 2011, which is a continuation-in-part of U.S. patent application Ser. No. 12/546,377, filed on Aug. 24, 2009, now U.S. Pat. No. 7,946,730, which is a continuation of U.S. patent application Ser. No. 11/868,406, filed on Oct. 5, 2007, now U.S. Pat. No. 7,597,456, which is a division of U.S. patent application Ser. No. 10/893,727, filed on Jul. 16, 2004, now U.S. Pat. No. 7,296,913, which claims priority to and the benefit of U.S. Provisional Patent Application No. 60/517,130, filed on Nov. 4, 2003. The entire disclosure of each of these applications is hereby incorporated herein by reference.

TECHNICAL FIELD

In various embodiments, the present invention relates generally to illumination systems and methods incorporating light emitting diodes (LEDs), and more specifically to such systems and methods that provide both direct illumination and decorative illumination.

BACKGROUND

Currently lighting applications are dominated by incandescent lighting products. Because they use hot filaments, these products produce considerable heat, which is wasted, in addition to visible light that is desired. Halogen-based lighting enables filaments to operate at a higher temperature without premature failure, but again considerable non-visible infrared light is emitted, and this heat is directed away from the lamp to the extent feasible. This is conventionally done by using a dichroic reflector shade that preferentially passes the infrared as well as a portion of the visible light. The nature of this dichroic reflector is such that it passes several different visible colors as well as the infrared radiation, giving a somewhat pleasing appearance. This has led to numerous decorative applications for such halogen lights. These lights consume substantial current and dissipate considerable unwanted heat. Halogen bulbs are designed to operate at a variety of voltages between 12 volts (V) to as high 15 V or greater.

Light emitting diodes have operating advantages compared to ordinary incandescent and halogen lights. LEDs typically emit a narrow range of wavelengths, thereby eliminating, to a large degree, wasted non-visible energy. White light can be created by combining light colors. LEDs can also emit in the ultraviolet wavelength range, in which case white light (as well as certain colors) can be created by excitation of a phosphor.

LEDs have an extremely long life compared to incandescent and halogen bulbs. Whereas incandescent and halogen bulbs may have a life expectancy of 2000 hours before the filament fails, LEDs may last as long as 100,000 hours, and 5,000 hours is fairly typical. Moreover, unlike incandescent and halogen bulbs, LEDs are not shock-sensitive and can withstand large forces without failure, while the hot filament of an incandescent or halogen bulb is prone to rupture.

Halogen bulbs, incandescent bulbs, and LEDs all typically require a fixed operating voltage and current for optimal performance. Too high an operating voltage causes premature failure, while too low an operating voltage or current reduces light output. Also, the color of incandescent and halogen lights shifts toward the red end of the visible spectrum as current and voltage are reduced. This is in contrast to LEDs, in which only the intensity of the light is reduced. Furthermore, as the voltage to an incandescent or halogen light is reduced, its temperature drops; as a result, its internal resistance decreases, leading to higher current consumption but without commensurate light output. In cases where batteries are used as the source of energy, they can be drained without producing visible light.

Incandescent and halogen bulbs require a substantial volume of space to contain the vacuum required to prevent air from destroying the filament, to keep the glass or silica envelope from overheating, and to insulate nearby objects from the emitted heat. In contrast, LEDs, as solid-state devices, require much less space and generate much less heat. If the volume of an incandescent or halogen bulb is allocated to a solid-state LED light, considerably more functions may be incorporated into the lighting product.

Unlike incandescent and halogen lights, LEDs ordinarily produce light in a narrow, well-defined beam. While this is desirable for many applications, the broad-area illumination afforded by incandescent and halogen lights is also often preferred. This is not easily accomplished using LEDs. The light produced by incandescent and halogen lights that is not directed towards the target performs a useful function by providing ancillary illumination and a decorative function. Halogen lights with their dichroic reflectors do this necessarily, but ordinary incandescent lights can employ external shades, not part of the light bulb, in a variety of artistic designs to make use of this otherwise misdirected light.

SUMMARY

Embodiments of the present invention overcome the limitations of halogen or incandescent light sources, and combine their desirable properties with the advantages afforded by LEDs into a unique system. Various embodiments include systems and methods that provide direct illumination as well as decorative illumination distinct from the direct illumination.

Embodiments of the present invention therefore include an LED-based light emitter (which includes one or more LEDs) for replacing standard incandescent and halogen bulbs for a wide variety of purposes. In accordance with various embodiments, lighting systems have enhanced functionality compared to that of conventional incandescent- or halogen-based lighting systems, and typically include a decorative illumination element that provides, e.g., decorative illumination distinct from the direct illumination from the light emitter.

Some embodiments include an electrical connector or base the same as or equivalent to a standard bulb base, a printed circuit board (or other circuit substrate or module) electrically connected to the base, a driving circuit that may be mounted on or embodied by the printed circuit board, and/or one or more LEDs of one or more colors that may be attached to the printed circuit board. The driving circuit may include or consist essentially of a solid-state circuit that regulates the voltage and current available from the electrical source (e.g., a power socket) and regulates the output to a constant value utilized by the LEDs. The available source voltage may be either greater than or less than that utilized by the LEDs.

Various embodiments of the present invention include an LED lamp that replaces incandescent and/or halogen lamps as well as their decorative shades by including LEDs on both sides of the printed circuit (PC) board, where the decorative LEDs may be on the opposite side of that intended for direct illumination. The decorative LEDs may, for example, illuminate an envelope or shade around the lamp.

Lighting systems in accordance with various embodiments may also include additional circuitry, e.g., to allow remote control of lighting functions via an infrared or wireless device; to change the color of either or both of the (decorative) shade illumination and the direct-illumination LEDs; to impart a time-varying color and/or intensity to the (decorative) shade illumination and/or the direct illumination; to enable external switching via mechanical action of color, pattern, and/or intensity on either the shade or direct illumination; and/or to enable the switching of the various functions of color, intensity, and/or pattern by interrupting the power to the circuit within a predetermined time interval.

Mechanisms such as mechanical actuators that alter the pattern and color of light to the shade for the purpose of decorative illumination may also be included. Such mechanisms may be or include a shadow screen, a multi-faceted mirror, or other reflective or diffractive optical component or components either fixed within the envelope of the lighting unit or which are configured to move in order to vary the pattern and/or color of the resulting light for decorative and/or direct-illumination purposes.

Various embodiments of the present invention feature one or more additional light emitters such as LEDs disposed within the envelope (housing) of the light bulb to provide the decorative illumination. A separate, secondary circuit may be used to produce a constant current for the additional, decorative light emitter(s) and control their decorative illumination characteristics such as intensity, color, pattern, and/or frequency. The secondary circuit may be connected to the main source of power. Light generated from the decorative light emitter(s) may be guided along at least a portion of the length of an optical component and exit the housing through openings on the shade of the housing. Such embodiments may include a secondary optical element to direct light generated by the light emitter for direct illumination (e.g., the primary-illumination LED(s)) to provide the decorative illumination. A heat sink may be thermally connected to any or all of the light emitters for regulation of their temperature. A circuit may provide remote control of lighting functions of the lighting system (e.g., the decorative light emitter(s)) via, e.g., an infrared or wireless device.

One or more optical components may be disposed within the housing, and may direct a first, larger (e.g., more intense) portion of light generated by the light emitter(s) for direct illumination and direct a second, smaller (e.g., less intense) portion of light for decorative illumination. The second portion of light may be guided along the length of a secondary optical component and exit the housing through one or more openings on the shade of the housing. In an alternative embodiment, the decorative illumination is achieved by light emission through a plurality of light paths connecting the housing and the optical component that directs the second portion of light from the light emitter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which.

DETAILED DESCRIPTION

Figure 1:
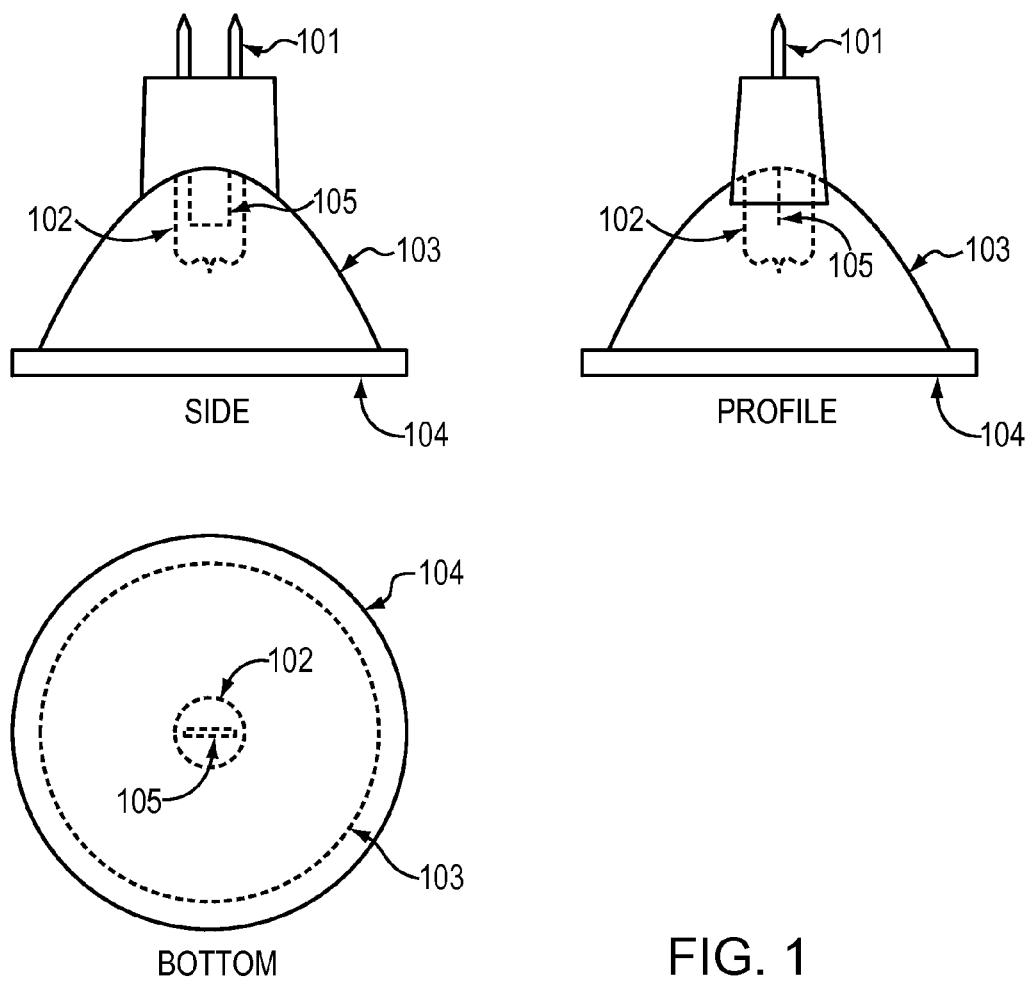
FIG. 1 illustrates various views of an exemplary halogen illumination device referred to commonly as an MR-16.

FIG. 1 illustrates an incandescent halogen-type bulb commonly available. The features of this bulb derive from its operating characteristics: it operates at high temperatures; it requires an evacuated envelope separated from the hot filament; it emits large quantities of infrared radiation experienced by the user as heat; and it consumes large quantities of electrical power. Nonetheless, these devices are in common usage and fixtures and appliances have been constructed to accommodate the form, fit, and function of these bulbs. This particular unit is a model MR-16.

The essential components of the bulb include a connector 101 that attaches to a standard source of electrical power (e.g., a power socket) that has a mating adapter; an evacuated transparent capsule 102 containing the hot filament 105; an envelope 103 that acts as a shade and filter to allow infrared radiation to pass, while reflecting a portion of the desirable visible light to the objects below; and a transparent front cover 104 that allows the radiation to pass, while protecting the evacuated capsule 102 from breakage.

Figure 2:
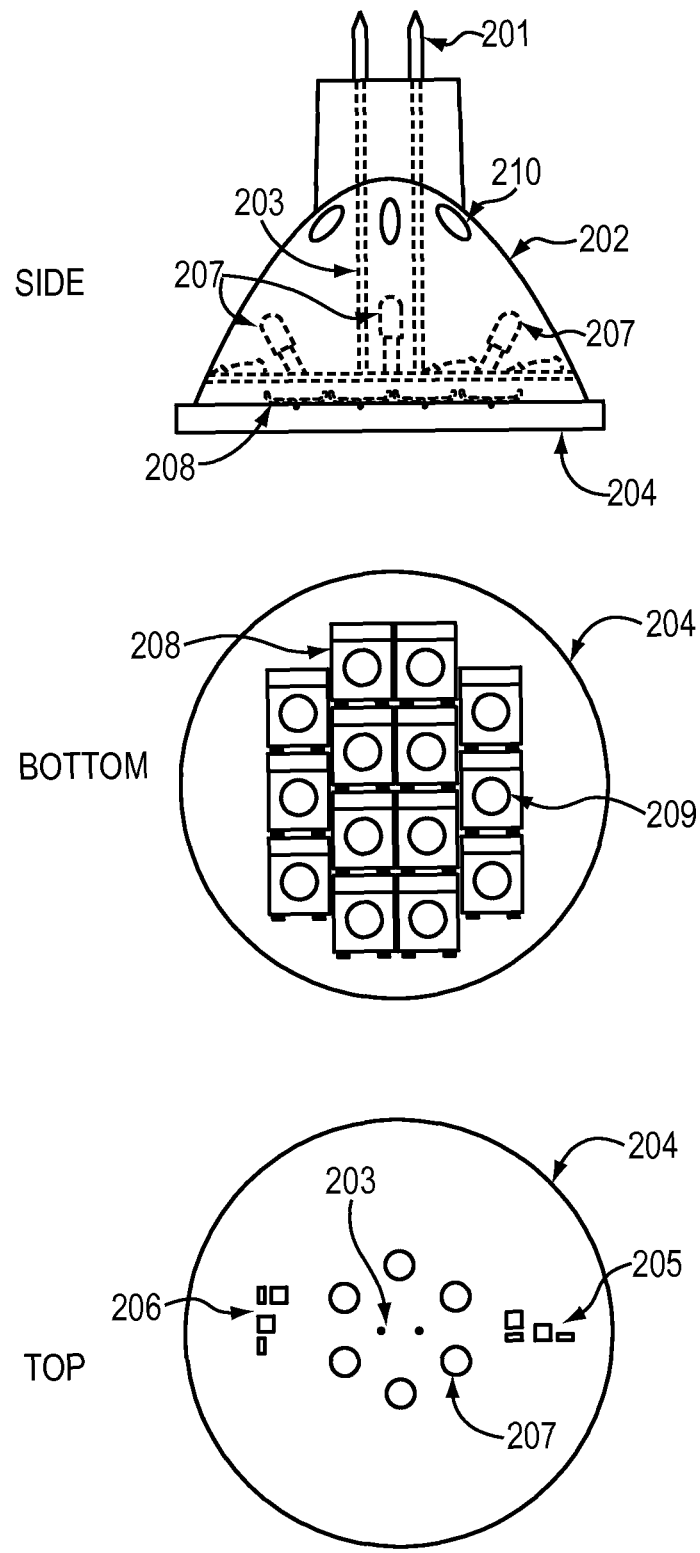
FIG. 2 illustrates various view of an embodiment of the present invention that can retrofit the halogen illumination device and contains LEDs for illumination on one side and LEDs for direct illumination on the other. Circuitry to enable regulation and other features is also shown.

FIG. 2 illustrates an embodiment of the current invention. This illuminating device preferably has the same form, fit and function as the incandescent illumination device of FIG. 1 and as such has a similar electrical connector 201 and similarly shaped transparent or translucent envelope 202. The envelope 202 will generally act to scatter light emitted from inside the envelope and be visible from the outside. As such, the envelope 202 may serve as a screen onto which are projected and displayed images, colors or other decorative or information-containing light either visible to humans or at shorter or longer wavelengths. The decorative or informational content may be generated by circuitry contained on one or more circuit boards 206 within the envelope of the bulb 202. This circuit 206 in its simplest form controls other illumination devices such as, e.g., the LEDs 207 located on the back of the circuit board 204. Another circuit 205 may be used to control high-power LEDs 209 in an array 208 for direct illumination of objects outside the envelope of the lighting device. However, this circuit or circuits may enable several useful features, including (i) a timer to adjust the color and illumination level according to some preset or user-adjustable schedule, (ii) a photocell to turn the light on or off depending on the ambient light level and or a proximity sensor, (iii) a signaling function that communicates with other lights, and/or (iv) a user-accessible switch that enables switching of illumination characteristics such intensity, color, and/or continuous or flashing illumination modes.

Also typically located on circuit board 204 is a power-conditioning circuit 205 that regulates power to the high-intensity LEDs 208 located on the underside of the board. This circuit adapts and controls the power available via the connector 201 and conducted to the board via wires 203. The circuit 205 may contain storage features including a battery to enable the lighting device to act as an emergency light source in the event of a power failure. The circuit may rectify AC power to DC to suit the desired current and voltage required by the series and/or parallel array of LEDs and provide power to other on-board circuitry.

In this embodiment, the LEDs 207 on the backside of the PC board 204 may serve the function of communication and/or decoration. For decorative purposes, the shade 202 is preferably made of a colored or white transparent (or preferably translucent) material such as plastic or glass that is textured to scatter light. In this manner light from the LEDs 207 impinges on this surface and is made more visible to the user, and may serve the function of decoration. The shade 202 may also contain penetrations 210 to allow heat to exit the LED enclosure.

Figure 3:
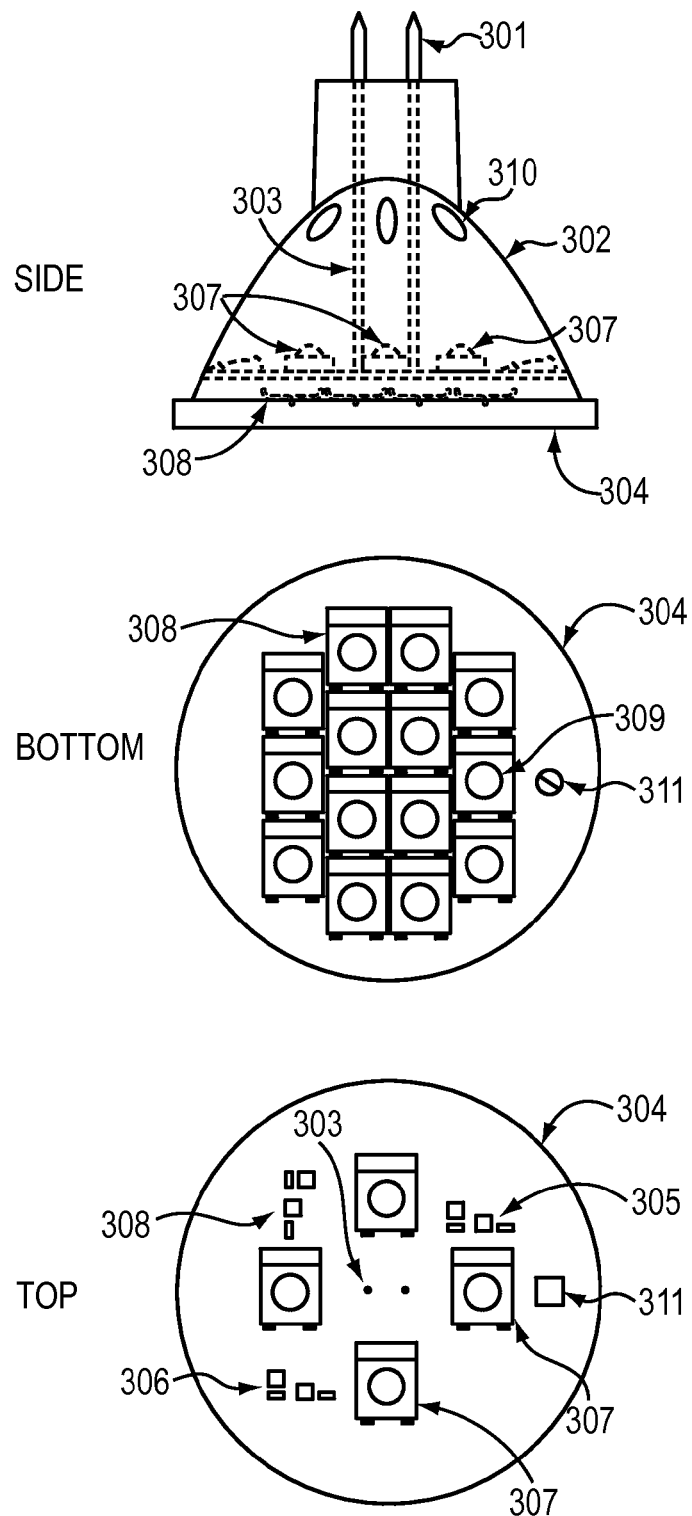
FIG. 3 illustrates various views of an embodiment of the present invention in which high intensity LEDs are placed on both sides to produce shade illumination and direct illumination. A switch and circuitry for changing the attributes of the lighting is also shown.

FIG. 3 illustrates a similar incandescent replacement product. This product also contains an electrical connector 301, a shaped translucent or transparent envelope 302 with holes 310 to remove heat, one or more printed circuit boards 304 within the enclosure, and means such as wires 303 to conduct electrical power to these board(s). This embodiment has high-intensity illumination LEDs 307 on the top surface and other high-intensity LEDs 309 in an array 308 on the bottom surface. Unlike the product of FIG. 2, which had small LEDs with a narrow exit beam and low intensity, these high intensity LEDs 309 and 307 have a higher light output (generally greater than 10 lumens), and the exit angle of the light may range from a narrow angle to a very broad beam as desired. To control these LEDs, additional circuitry may be required as shown in the figure. In addition to the power-transforming circuit 305 and the control circuits 306, additional power handling circuits 311 may be included. The high-power LEDs may have one or more colored light outputs other than white, and have different orientations other than vertical to provide decorative illumination above the lighting product. A switch 311 that is accessible by the user may be used to control characteristics of operation of the lighting product.

Figure 4:
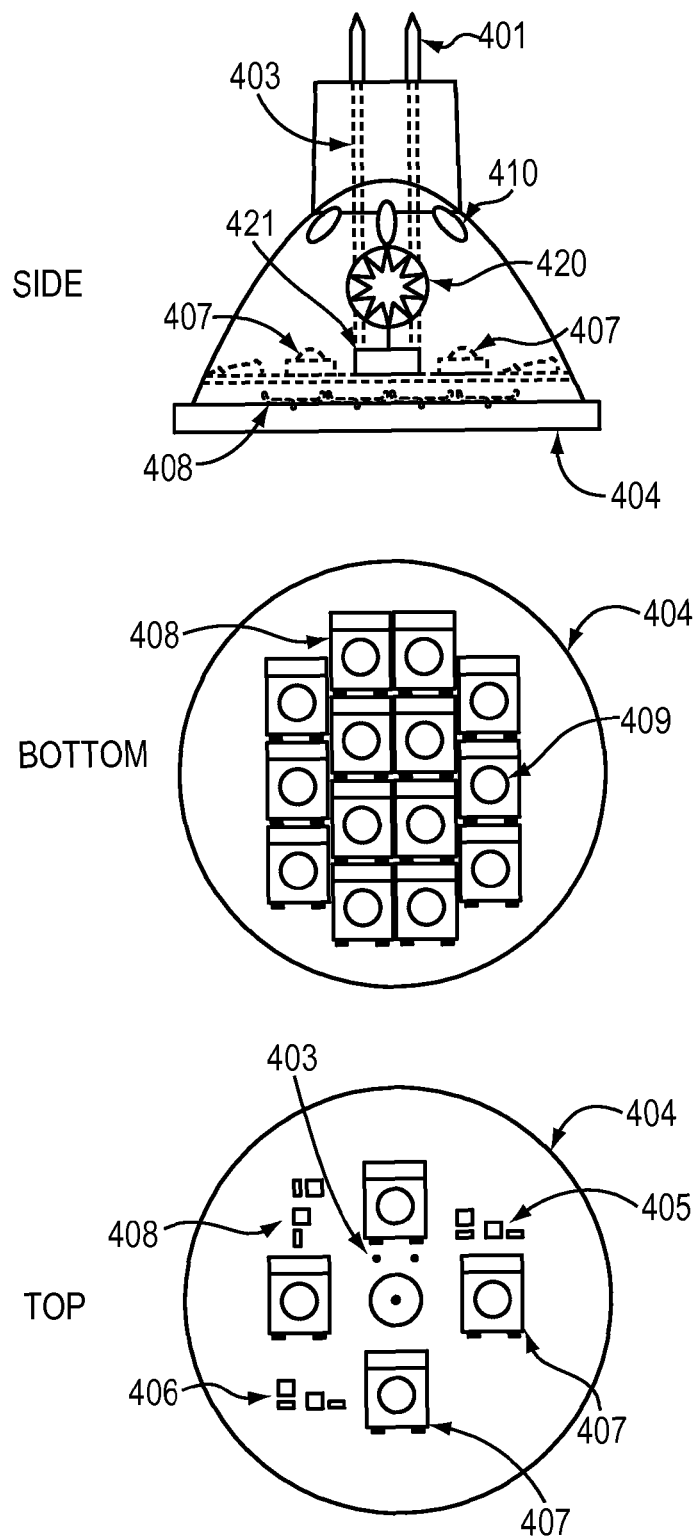
FIG. 4 illustrates various views of another embodiment of the present invention in which a movable, multifaceted mirror is included on the shade side of the illumination unit to provide a variable pattern on the shade.

FIG. 4 illustrates another embodiment of the present invention. Unlike the previous examples in which modification of the color, intensity and pattern is performed by electrically controlling the electrical power to individual devices of one or more orientations and/or color, this embodiment contains a mechanical feature for varying the intensity and/or pattern with time. Variation is accomplished by, for example, a multi-faceted mirror 420, operated by a miniature electric motor 421 that changes the orientation and position of the mirror. In this way light is reflected or diffracted to form a pattern of shapes and/or color on the translucent or transparent envelope 402.

Figure 5A:
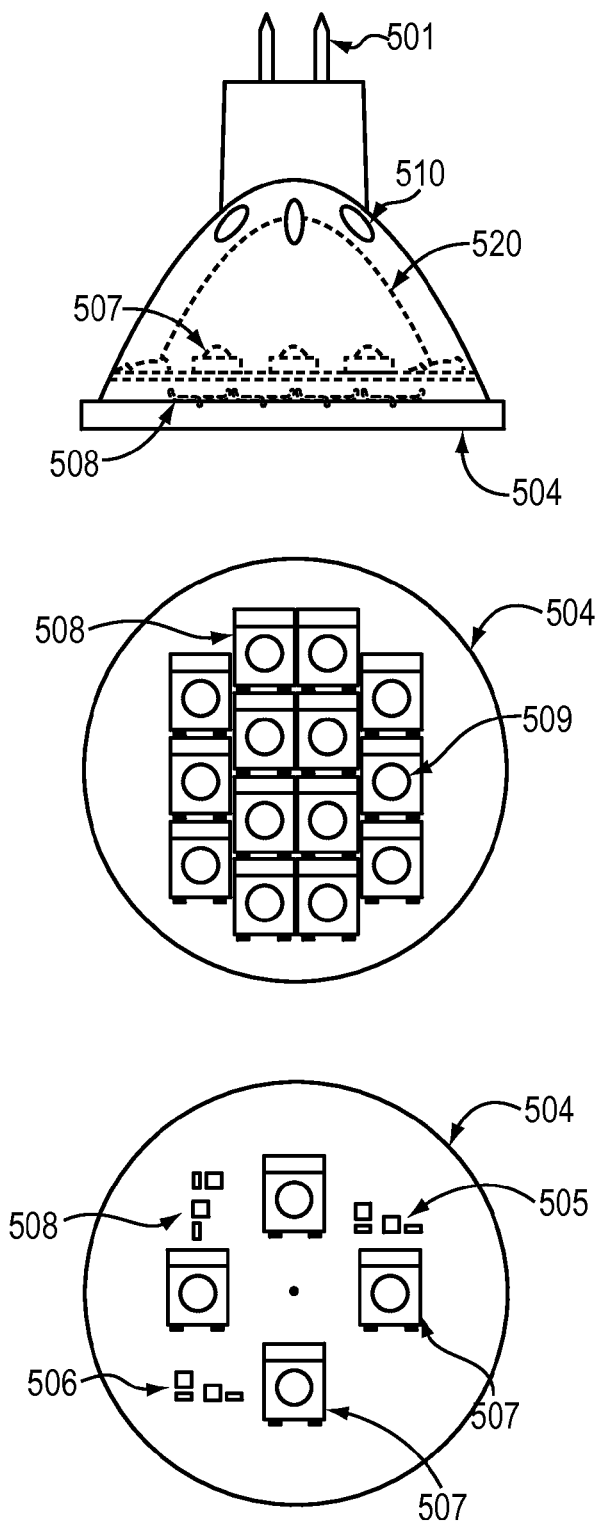
FIG. 5A illustrates various views of another embodiment of the present invention in which an internal fixture containing apertures is included to pattern illumination to the shade.

FIG. 5A illustrates another embodiment that includes a patterned mask 520 (or other suitable means) that casts a shadow or other predetermined pattern by blocking or otherwise modifying the pattern of light emanating from the internal LEDs 507 located on the back side of the circuit board 504. Other features from other embodiments discussed herein may also be incorporated.

Figure 5B:
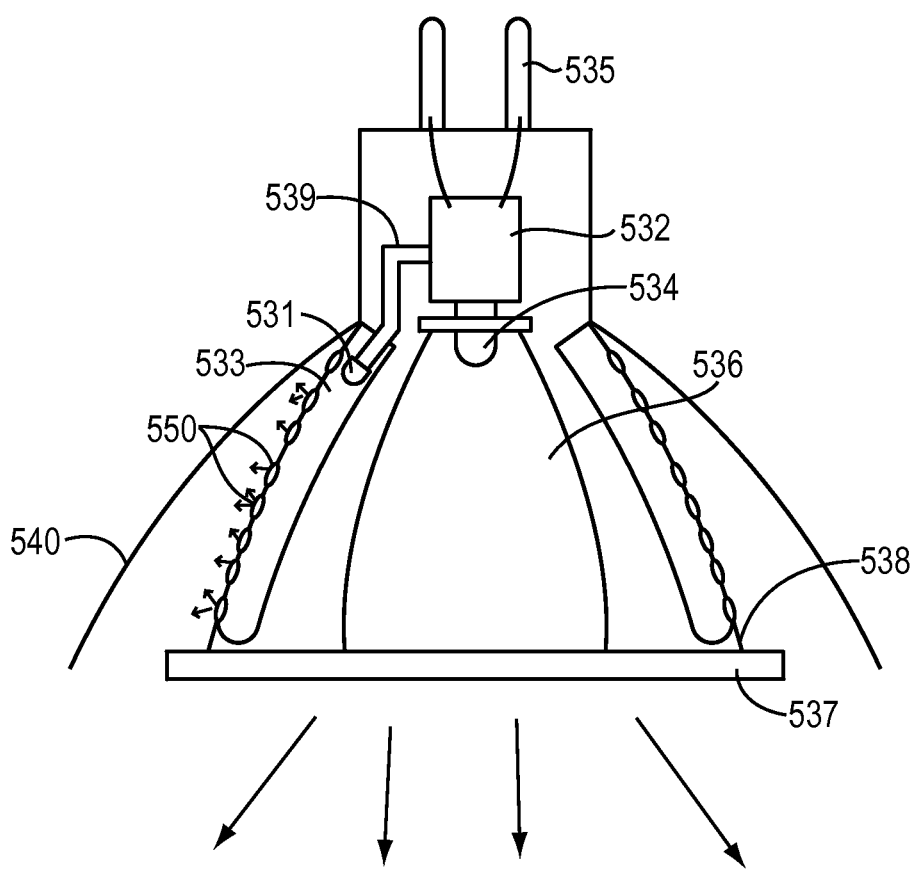
FIG. 5B is a sectional view of another embodiment of the present invention in which an additional LED is disposed within the housing to produce decorative illumination.

FIG. 5B illustrates another embodiment in which an additional, separate light emitter 531 (such as, e.g., one or more LEDs) is controlled and/or powered by a main illumination circuit 532. The light emitter 531 may be coupled to separate and dedicated optics 533 to provide flexibility in design, as light emitter 531 is generally meant to provide decorative illumination that is distinct from and that complements the direct illumination from the primary illumination source 534. For example, the decorative illumination may be different from the direct illumination at least in terms of illumination direction, color, and/or intensity. Power is provided via connection of a power connector 535 to an input power source, which, for example, may be either 115 VAC or 12 VAC. A circuit 532 is preferably used to convert the alternating voltage to an approximately constant DC current.

Light generated by the primary illumination source 534 may be directed by an optical component 536 (e.g., a total-internal-reflection (TIR) optic) and exit a substantially transparent cover 537 attached to the housing (envelope) 538 to provide direct illumination. Electrical connector (or circuit) 539 typically connects the light emitter 531 to the circuit 532, which may produce a smaller constant current for the decorative light emitter 531 than that for the primary illumination source 534. Electrical connector 539 may be connected to the main power source; it may include or consist essentially of a resistor that limits current to the decorative light emitter 531 and that is in parallel to the primary illumination source 534. The circuit 539 may contain other suitable electronics that modulate or adjust the decorative illumination, such as the intensity, color, and/or frequency of the decorative light emitter 531. The light from the decorative light emitter 531 may be emitted in substantially the same direction as light from the primary illumination source 534, but separate optics may be utilized to accomplish the desired decorative illumination. For example, light-guiding optics 533 may include an optical light guide or a solid plastic pipe that directs light along its length, creating a linear "stripe" of light down the outside of the device.

A heat sink 540 may be thermally connected to the thermal path of the illumination device and thus regulate the temperature of the primary illumination source 534; the heat sink 540 may be co-linear with the light-guiding optics 533. Characteristics of the decorative illumination arising from light emitter 531, such as the intensity, color, frequency, and/or pattern of the light, may be responsive to a remote control that may be either optical (e.g., infrared), wireless (e.g., radio-frequency), or wired (Ethernet, RS-232, etc.).

As described above, a backward-facing LED sharing a PCB with a primary illumination source may be used for decorative illumination. Furthermore, a separate light emitter, e.g., with dedicated control and/or power circuitry, in the housing may provide decorative illumination. In both cases, decorative illumination is formed actively from a secondary light emitter providing its own light.

In another embodiment of the present invention, decorative illumination is created passively via utilization of a portion of the light from the primary illumination source. Reflecting optics may be used to direct light from light sources such as LEDs for direct illumination. Such reflecting optics may be aluminized reflectors that may have a parabolic shape to enhance the directionality of the forward light. The optics may also include TIR optics, which utilize the refractive index difference between two different media to yield a reflective internal surface. TIR optics are often very high efficiency (85-90%) compared to ordinary metal-coated reflectors. The design of both types of reflectors is generally intended to maximize optical efficiency with the goal of providing the highest degree of illumination.

To provide illumination for decorative or other purposes not involving direct illumination, embodiments of the present invention use TIR and other reflecting optics to divert a portion of the light from its otherwise intended path by modifying the optical design of the TIR and other reflecting optics. A portion of light may be "siphoned off" in a controlled way and by means of reflection and refraction be redirected to create the decorative or other non-direct-illumination function. The redirected light may then be used to achieve the desired shape and color for decorative purposes.

Figure 5C:
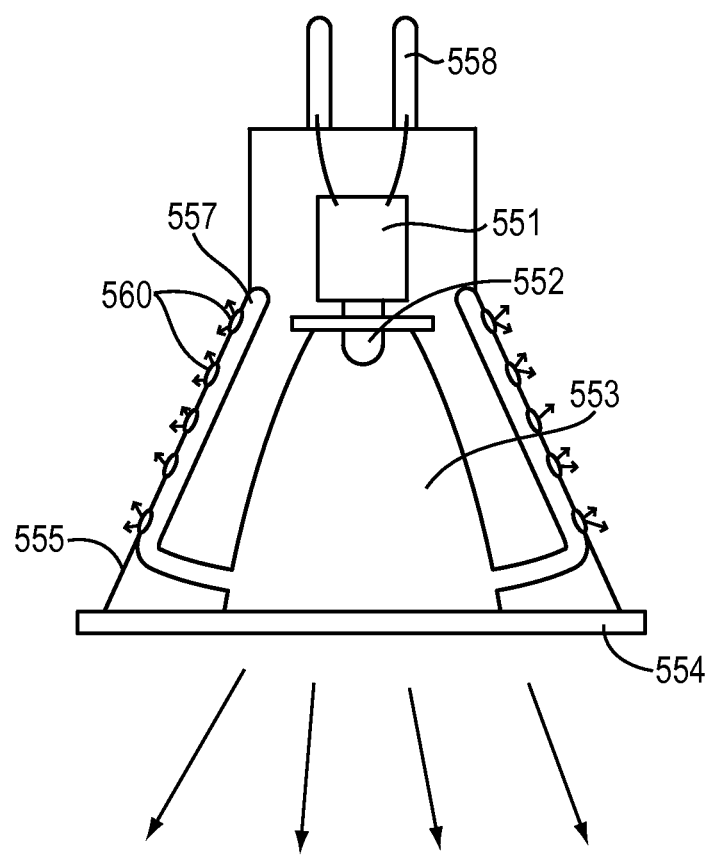
FIG. 5C is a sectional view of another embodiment of the present invention in which decorative illumination arises from an optical component that directs light generated from the primary light emitter.

FIG. 5C illustrates another embodiment of the present invention in which a drive circuit 551 converts the mains voltage into a constant current for a primary illumination source 552 (e.g., one or more LEDs). An optic 553 (which may include or consist essentially of, e.g., a TIR lens) may be used to direct light generated by the primary illumination source 552. A first portion of light generated by the primary illumination source 552 is guided for direct illumination, and a second portion of light is guided for decorative illumination. The first portion of the light is usually larger (i.e., more intense) than the second portion of the light. The first portion of the light generated by the primary illumination source 552 may be directed by the optic 553 and exit a substantially transparent cover 554 attached to the housing (envelope) 555 to provide direct illumination. The housing 555 may include a shade (which may be substantially translucent) and one or more openings 556 in an optical component 557 (e.g., an optical waveguide that may be completely or partially transparent) through which light may exit as decorative illumination. Other approaches such as diffusion and filtering of the light by the optical component 557 may be employed to further condition the light to meet specific decorative or secondary illumination purposes.

Figure 5D:
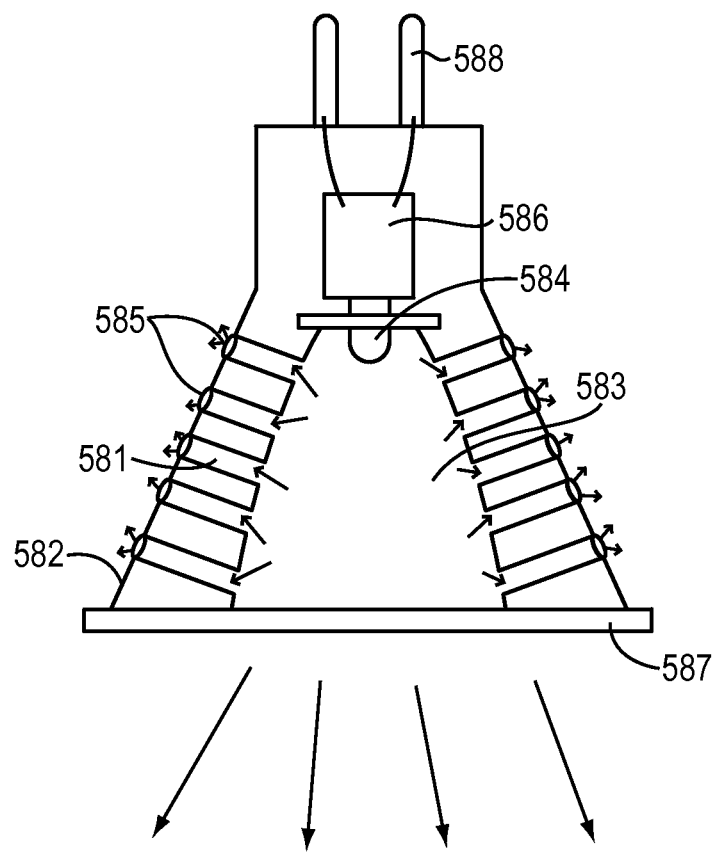
FIG. 5D is a sectional view of another embodiment of the present invention in which a plurality of the light paths, connecting the housing and the optical component, direct a portion of the light from the primary light emitter for decorative illumination.

FIG. 5D illustrates another embodiment of the invention operating via similar principles. One or more light channels 581 may connect a housing 582 to an optical component 583 and be utilized to produce decorative illumination therethrough. The light channels 581 may be, e.g., substantially empty passages through the housing, or they may be partially or substantially filled with an optical waveguide material. A portion of the light generated by a primary illumination source 584 (e.g., one or more LEDs) may be directed through the light channels 581 and exit the housing 582 through complementary openings 585 on the shade of the housing 582.

It may be appreciated from these descriptions that the LEDs used in these embodiments, though small, occupy considerable space that limits the overall light output of the product. This is due, at least in part, to the need to provide electrical connections to each of the semiconductor light-emitting chips that are housed in large packages that provide both electrical connections and a facility for removing heat and enabling passage of useful light. The packages also often contain a lens or mirror for shaping and directing this light. While these packages allow some freedom of use, they also limit the density and eliminate the ability to integrate the functions of heat dissipation, light direction and electrical connection. Many of these functions may be accommodated within a printed circuit board of appropriate design for a group of devices at the same time and within the circuit as it is formed.

Figure 6:
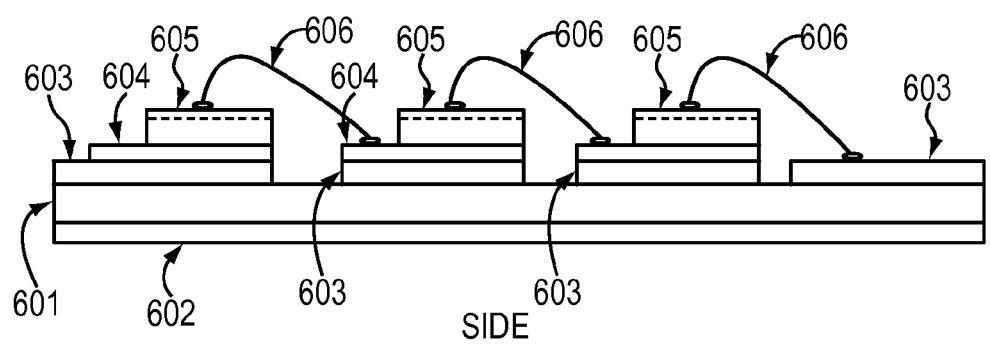
FIG. 6 shows elevational and top views of a means for producing a series/parallel circuit comprised of individual LED semiconductor chips on a circuit board that results in a high-density lighting array.
Figure 6:
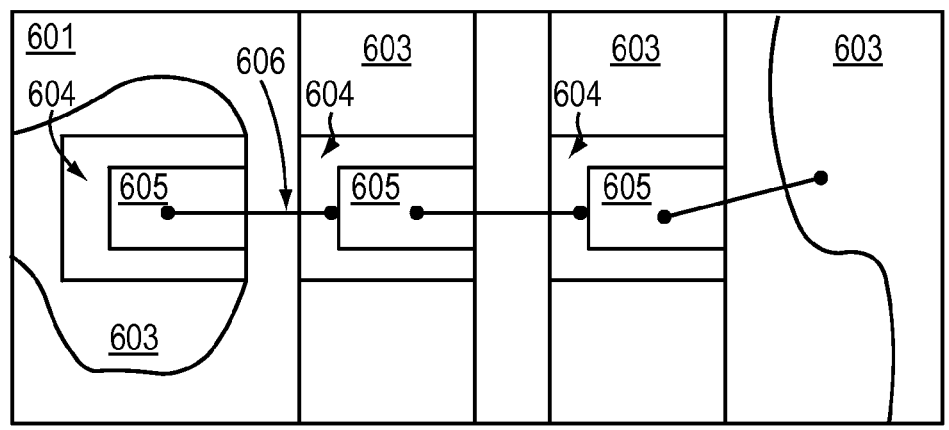

One way of improving the light density of the overall product is to incorporate the light-emitting dies onto a suitable patterned circuit board that contains the external circuitry needed to power and connect the LED devices without the use of a package. FIG. 6 illustrates such an arrangement. This embodiment includes or consists essentially of a printed circuit board having at least a middle portion 601 that may be the usual fiberglass core or one that contains metals, ceramics or other materials to enhance thermal conductivity, a top metal clad layer 603, and a bottom cladding layer 602. It should be well understood that these top and bottom layers can easily be patterned by such processes as etching. A light-emitting assembly may be attached to the patterned surface of cladding 603 by cementing it with a thermally and electrically conducting compound, by welding it, or using any other suitable attachment technique. The cladding 603 then may act as a thermal or electrical conducting pathway, or both. The light-emitting assembly may include a metal base 604 to which is bonded a semiconductor light-emitting chip 605. This light-emitting chip 605 typically contains a p-n junction that emits light and conducting top and bottom surface layers for electrical and thermal contact. A conducting wire or tab connects the top conducting member of the junction to the opposite conducting pad on the next assembly, thus building up a circuit that is in series. Using a different connection scheme, but the same general approach, a parallel connection may be assembled. By doing this, a relatively dense build-up of light-emitting chips may be assembled using the thermal and electrical transfer characteristics of the printed circuit board. Furthermore, heat sinking, cooling or other components may be attached to the board, improving performance, for example on the back side 602 of the printed circuit board. Although not shown, it should be understood that this connection method may be extended in the two dimensions of the plane of the board.

Such chips as illustrated in FIG. 6 will generally emit light in all directions. Such a distribution of light may not be desired for many lighting applications. Therefore, a matching array of lenses that is positioned over the light-emitting chips may be utilized. This separation of the top lens array from the LEDs allows the lens array to be positioned independently, so that the light directed by the lens may be moved and/or focused by moving the lens array in three dimensions. The movement may be controlled via, for example, stepper motors or piezoelectric-activated motion controllers whose support electronics are also contained on the printed circuit board. The array of lenses may be molded from a transparent clear or colored material with a variety of spherical or hemi-spherical shapes.

Figure 7:
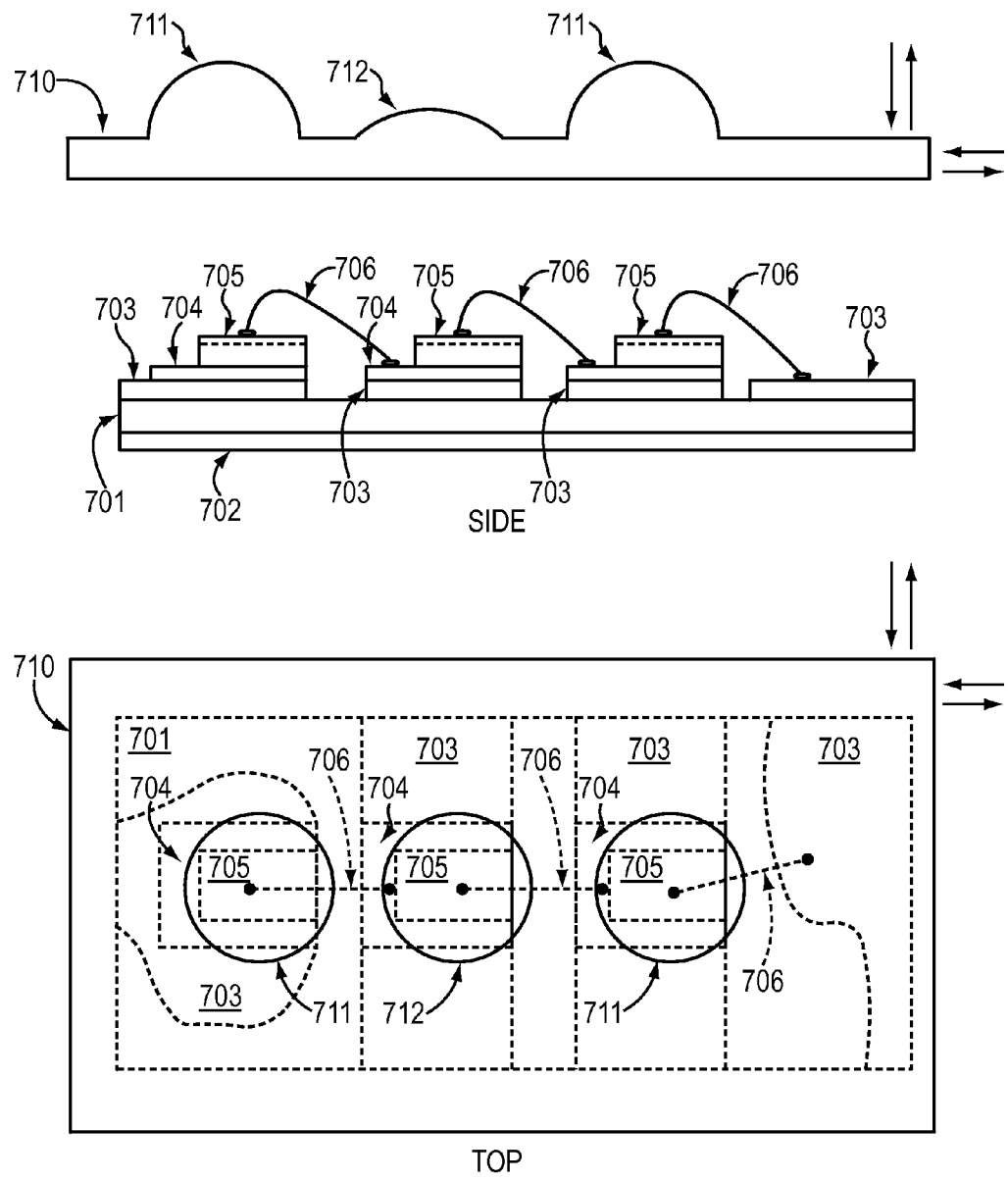
FIG. 7 shows elevational and top views of an embodiment of the high-density LED array coupled with an integrated lens array that is movable to produce variable-directional lighting.

FIG. 7 illustrates such an arrangement. A PC board 701 containing patterned metal traces 703 has located on its surface light-emitting portions featuring semiconductor light-emitting devices 705 that are mounted on bases 704. These areas are bonded together with electrically conducting wires or strips to form a series/parallel circuit. Positioned over the top of these light-emitting regions is a lens array 710 into which has been formed (by a method such molding) a matching series of optical elements. Three such elements of two different shapes labeled 711 and 712 are shown. This lens array 710 is spaced apart from the semiconductor array and mounted to facilitate external manipulation in one or more of three dimensions as shown by the opposing pairs of arrows. Hence, by moving the lens array 710, the light emitted from the matching LED array may be directed and focused as required, in essence steering the light beam. This may be controlled by onboard electronics, and via remote control or such other means as required such as proximity sensors, timers and the like.

These lighting products generally require a source of AC or DC current. Although LEDs utilize direct current, it is possible to use the LEDs to rectify AC power provided the number of LEDs is chosen to match the AC voltage. It is well understood how to transform AC power to DC. The use of DC power as supplied by batteries, however, may present some problems because as the battery voltage declines under load, the current drawn by the LEDs rapidly declines, owing to the extremely non-linear current-voltage characteristics of the diodes. Since the light output of a LED is typically directly proportional to current (at least in some regimes), this means the light output rapidly declines. On the other hand, if battery voltage exceeds a predetermined level, heating of the semiconductor junction of the LED is excessive and may destroy the device. Moreover, excess heat in the LED junction may cause a condition called thermal runaway, in which the heat raises the current drawn at a given voltage, leading to further heating, which in turn leads to greater current draw and quickly destroys the device. This may be a particular problem with high-power LEDs and requires careful thermal management.

Figure 8:
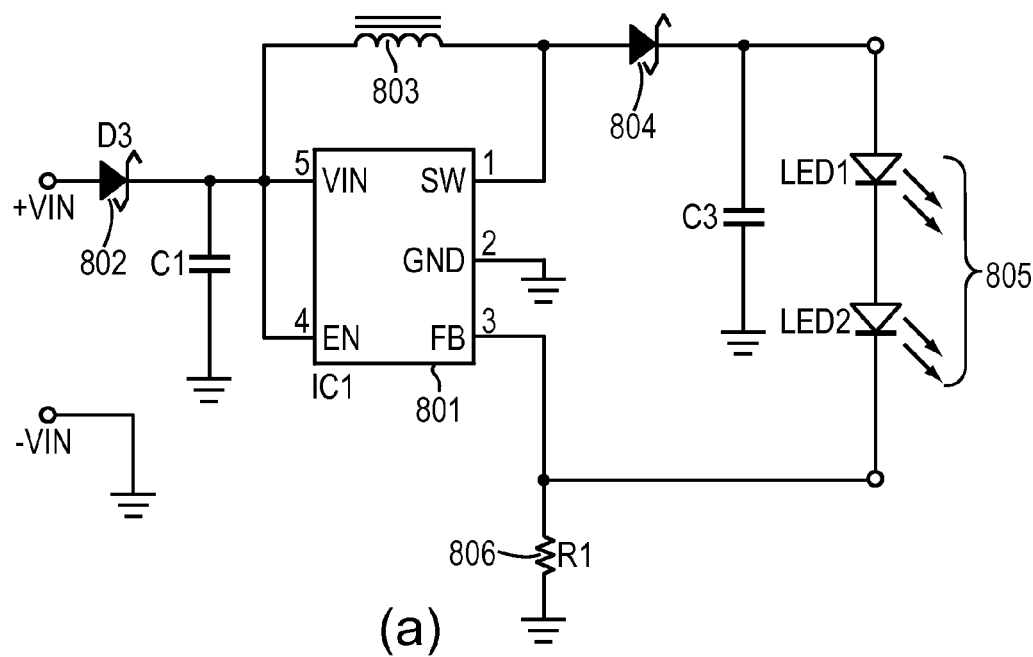
FIGS. 8(a) and 8(b) schematically illustrate a constant-current implementation of a compact dc/dc boost converter with a feature that enables current regulation of LEDs based on the thermal environment.
Figure 8:
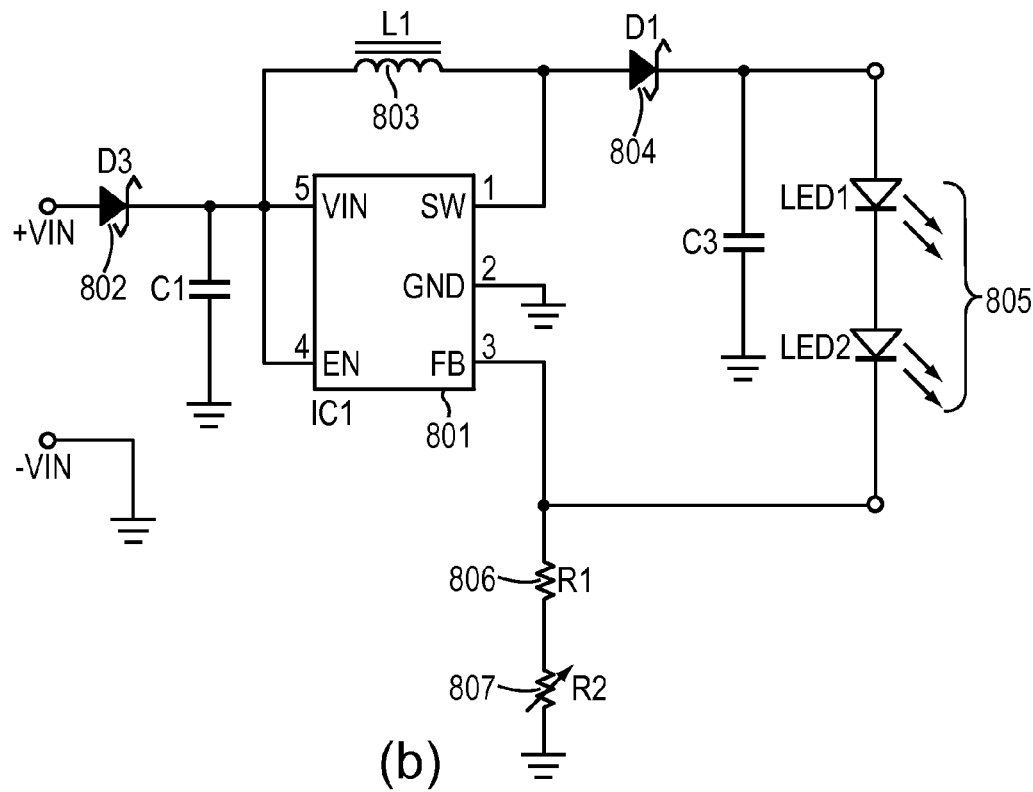

In order to help avoid this problem it may be useful to fix the current through the LEDs rather than the voltage. Using a battery as the source of current, however, presents a problem because of the differing voltage and current behavior of the battery power source and the LED load. Therefore, a circuit may be utilized to regulate and fix the current independent of the voltage supplied by the battery. In the case where the battery voltage is less than the load voltage required by the series and/or parallel LED circuit, a boost circuit as shown in FIGS. 8(*a*) and 8(*b*) may be employed. In these circuits an integrated circuit device, IC1 801, is used to control the charging and discharging of an inductor L1 803. This integrated circuit may be any of several that are available such as the Texas Instruments TPS61040. After a charging cycle, the IC switches the circuit so that the inductor L1 803 is permitted to discharge through the load, which in this case is the light-emitting diodes 805. The current is controlled via a feedback resistor R1 806. The value of the resistor is chosen to fix the maximum current that is permitted to flow through the load, which in this case, is one or more LEDs (LED1, LED2) indicated at 805. This manner of control occurs because the voltage drop across R1 806 is compared to an internally generated reference voltage at pin FB of IC1 801. When the two voltages are equal the current is considered fixed and will be held to that predetermined value. A diode D3 802 is used to ensure protection of the IC1 801 in case the battery source (not shown) is connected backwards. The diode 804 allows current flow through the LEDs 805 in only the forward, or light-emitting direction. In embodiments of this invention, such a circuit may be enclosed within the envelope of the bulb.

The circuit shown in FIG. 8(*b*) differs from that of FIG. 8(*a*) in that the former contains an easy and inexpensive means of protecting the LEDs from excessive current flow and the runaway that results from high temperatures. In this circuit a resistor with a positive resistance rate of change with temperature, R2 807 is placed in series with a fixed resistor. Resistor R2 is physically located on the circuit board so as to be in the thermal pathway of heat emanating from the LEDs 805. Therefore, when the temperature of the LEDs 805 increases, the resistance of R2 807 also increases, and its resistance is added to that of R1 806. Since the voltage drop across these combined resistances appears on the feedback pin FB of IC1 801, the increased voltage is interpreted as a request for decreased current. Hence, the natural tendency of the LEDs 805 to draw more current, which would ordinarily lead to the failure of the part, is averted by introducing a self-limiting control function.

This circuit has the advantage of being very efficient and compact and having built into it a temperature regulation that allows the resulting system to automatically adapt to the thermal environment in which it is placed. Because of these attributes, it may, for example be put into a miniature lamp base of the kind used for flashlights (e.g., a PR-type flange base).

However, one possible limitation of the circuit is that it may only boost voltage from a lower value to a higher value required by the LED load. Therefore, in situations where only one LED is required, but a higher input voltage is all that is available, the excess voltage will generally appear across the LED even if one of the circuits in FIG. 8 are used. This may cause an excessive current to be drawn, leading to premature failure of the LED and/or premature draining of the battery. To solve this problem, embodiments of the invention feature a circuit that is preferably still compact enough to fit into a bulb or bulb base, and that is capable of either raising or lowering the output voltage above or below the voltage of the incoming battery or other DC supply in order to maintain the desired current through the LED load. The circuit will either boost the voltage if the input voltage is lower than required by the LED or reduce the voltage if it is higher than that required to sustain the necessary constant current through the LED. It is understood that references to an LED connote one or more LEDs in a series, parallel or series/parallel circuit. Furthermore, because of the deleterious effects of temperature, this circuit typically has the ability to regulate the current through the LED depending on the ambient temperature. The ambient temperature may be determined by the environment as well as heat dissipated by the circuit and the LED.

Figure 9:
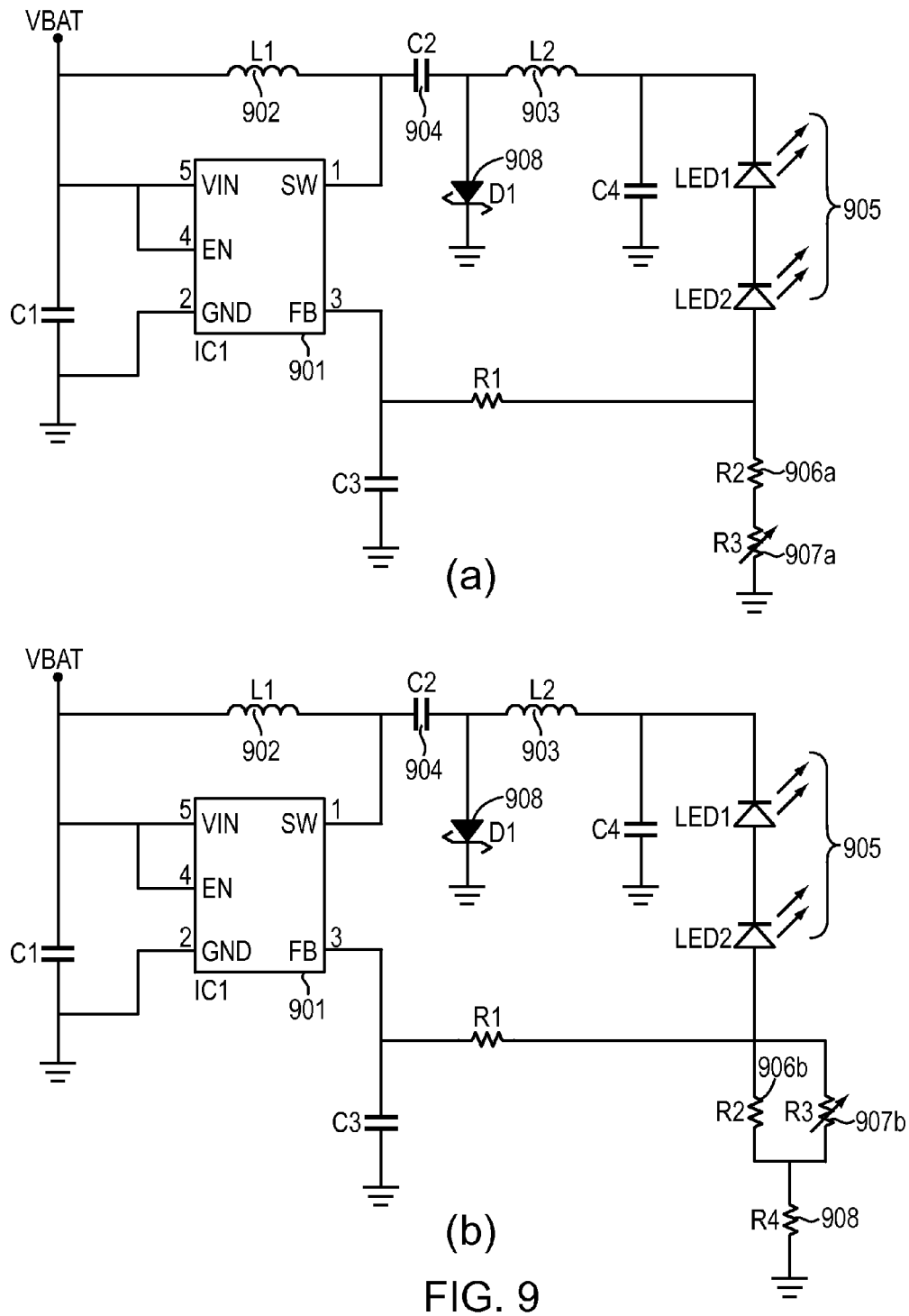
FIGS. 9(a) and 9(b) schematically illustrate a compact constant-current buck/boost circuit for current regulation based on the thermal environment in accordance with various embodiments of the invention.

Such a circuit is depicted in FIG. 9. This circuit utilizes a so-called Cuk converter that is ordinarily used as an inverting-switching voltage regulator. Such a device inverts the polarity of the source voltage and regulates the output voltage depending on the values of a resistor bridge. In the illustrated embodiment, the inverter circuit has been altered so that it acts to boost the voltage output or buck the voltage input in order to maintain a constant current through the load represented by one or more LEDs 905. The circuit incorporates an integrated circuit IC1 901 such as the National Semiconductor LM2611 Cuk Converter or equivalent. In this circuit, the internal transistor of IC1 is closed during the first cycle charging the inductor L1 902 from the battery source indicated as Vbat. At the same time the capacitor C2 904 charges inductor L2 903, while the output current to the LEDs 905 is supplied by inductor L2 903. In the next cycle the IC1 901 changes state to permit the inductor L1 902 to charge capacitor C2 904 and L2 903 to discharge through the LEDs 905. The control of the charging power and current through the load is performed by the resistor network including or consisting essentially of R2 906a and R3 907a. The overall value of these resistors together with the current passing through the LEDs 905 from ground, sets a voltage that appears on the feedback pin (FB) of IC1 901. Resistor 907a has a positive temperature coefficient so that its resistance increases with temperature.

The current may also be altered to accommodate thermal effects such as heat dissipation by the LEDs, heat produced by the IC1 or other circuit components and/or the ambient environmental conditions. This is effected by a temperature-dependent resistor R3. In FIG. 9(a), resistor R3 907a has a positive temperature coefficient in which the resistance increases with temperature. The additive effect of the series circuit with R2 906a means that as temperature rises, the overall resistance of the combination does also, leading to an increase in voltage drop. This in turn causes IC1 to decrease the output current to the LEDs 905. In FIG. 9(b) the resistor network includes resistors in parallel and series. In this instance, resistors R2 and R4 906b, 908 are fixed and resistor R3 907b is temperature-dependent with a positive temperature coefficient. The use of a parallel arrangement allows a greater freedom of choice of temperature dependence than a simple series arrangement.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination device comprising:
   a housing;
   a power connector for connecting the illumination device to a power socket and receiving an input power;
   a light emitter disposed within the housing;
   a circuit for regulating the input power and providing the regulated power to the light emitter; and
   an optical component for directing a first portion of light generated by the light emitter for direct illumination in a first direction and a second portion of light generated by the light emitter for decorative illumination in a second direction, the second direction being different from the first direction,
   a plurality of light channels extending between the housing and the optical component for directing the second portion of light, thereby providing the decorative illumination.

2. The illumination device of claim 1, wherein the first portion of light is more intense than the second portion of light.

3. The illumination device of claim 1, wherein the first portion of light exits through a cover attached to the housing to provide direct illumination.

4. The illumination device of claim 3, wherein the cover is substantially transparent.

5. The illumination device of claim 1, wherein the housing comprises a substantially translucent shade, the second portion of light exiting the shade to provide decorative illumination.

6. The illumination device of claim 5, wherein the shade contains openings through which the second portion of light exits the housing for providing the decorative illumination.

7. The illumination device of claim 1, further comprising a secondary optical component for further conditioning the second portion of light for decorative illumination.

8. The illumination device of claim 7, wherein the further conditioned second portion of light and the direct illumination are distinct in terms of at least one of a direction, a color, or an intensity.

9. The illumination device of claim 1, wherein the light channels are partially or substantially filled with an optical waveguide material.

10. The illumination device of claim 1, wherein the light channels are substantially empty.

11. The illumination device of claim 1, wherein portions of the housing connected to the light channels define openings allowing the second portion of light to exit the housing.

12. The illumination device of claim 1, wherein the light channels each extend in a substantially straight line from the optical component to the housing.

13. The illumination device of claim 1, wherein, in each light channel, (i) a first portion of the light channel directs light generally towards the housing, the light not exiting the housing from the first portion of the light channel, and (ii) a second portion of the light channel, different from the first portion, directs light in a direction approximately parallel to an outer contour of the housing, light exiting the housing from the second portion of the light channel.

14. The illumination device of claim 1, wherein the optical component comprises a total-internal-reflection optic.

15. The illumination device of claim 1, wherein the light emitter comprises one or more light-emitting diodes.

16. A method of using an illumination device to provide direct illumination and decorative illumination, the method comprising:
   generating light with a light emitter disposed within a housing;
   directing a first portion of light generated by the light emitter outside the housing in a first direction for direct illumination; and
   via an optical component disposed within the housing, directing a second portion of light generated by the light emitter outside the housing in a second direction for decorative illumination, the second direction being different from the first direction,
   wherein the second portion of light is directed through a plurality of light channels extending between the housing and the optical component.

17. The method of claim 16, wherein the light channels each extend in a substantially straight line from the optical component to the housing.

18. The method of claim 16, wherein, in each light channel, (i) a first portion of the light channel directs light generally towards the housing, the light not exiting the housing from the first portion of the light channel, and (ii) a second portion of the light channel, different from the first portion, directs light in a direction approximately parallel to an outer contour of the housing, light exiting the housing from the second portion of the light channel.

19. An illumination device comprising:
a housing comprising a substantially translucent shade;
a power connector for connecting the illumination device to a power socket and receiving an input power;
a light emitter disposed within the housing;
a circuit for regulating the input power and providing the regulated power to the light emitter; and
an optical component for directing a first portion of light generated by the light emitter for direct illumination in a first direction and a second portion of light generated by the light emitter for decorative illumination in a second direction, the second direction being different from the first direction,
wherein the shade contains openings through which at least some of the second portion of light exits the housing for providing the decorative illumination.

20. The illumination device of claim 19, wherein the first portion of light is more intense than the second portion of light.

21. The illumination device of claim 19, wherein the first portion of light exits through a cover attached to the housing to provide direct illumination.

22. The illumination device of claim 21, wherein the cover is substantially transparent.

23. The illumination device of claim 19, further comprising a secondary optical component for further conditioning the second portion of light for decorative illumination.

24. The illumination device of claim 23, wherein the further conditioned second portion of light and the direct illumination are distinct in terms of at least one of a direction, a color, or an intensity.

25. The illumination device of claim 19, further comprising a plurality of light channels extending between the housing and the optical component for directing the second portion of light to the openings in the shade, thereby providing the decorative illumination.

26. The illumination device of claim 25, wherein the light channels are partially or substantially filled with an optical waveguide material.

27. The illumination device of claim 25, wherein the light channels are substantially empty.

28. The illumination device of claim 27, wherein portions of the housing connected to the light channels define openings allowing the second portion of light to exit the housing.

29. The illumination device of claim 25, wherein the light channels each extend in a substantially straight line from the optical component to the housing.

30. The illumination device of claim 25, wherein, in each light channel, (i) a first portion of the light channel directs light generally towards the housing, the light not exiting the housing from the first portion of the light channel, and (ii) a second portion of the light channel, different from the first portion, directs light in a direction approximately parallel to an outer contour of the housing, light exiting the housing from the second portion of the light channel.

31. The illumination device of claim 19, wherein the optical component comprises a total-internal-reflection optic.

32. The illumination device of claim 19, wherein the light emitter comprises one or more light-emitting diodes.

33. A method of using an illumination device to provide direct illumination and decorative illumination, the method comprising:
generating light with a light emitter disposed within a housing, the housing comprising a substantially translucent shade;
directing a first portion of light generated by the light emitter outside the housing in a first direction for direct illumination; and
via openings in the shade, directing a second portion of light generated by the light emitter outside the housing in a second direction for decorative illumination, the second direction being different from the first direction.

34. The method of claim 33, wherein the second portion of light is directed through a plurality of light channels to the openings in the shade, the plurality of light channels extending between the housing and the optical component.

35. The method of claim 34, wherein the light channels each extend in a substantially straight line from the optical component to the housing.

36. The method of claim 34, wherein, in each light channel, (i) a first portion of the light channel directs light generally towards the housing, light not exiting the housing from the first portion of the light channel, and (ii) a second portion of the light channel, different from the first portion, directs light in a direction approximately parallel to an outer contour of the housing, the light exiting the housing from the second portion of the light channel.

* * * * *